United States Patent [19]

Lebailly

[11] 3,942,185

[45] Mar. 2, 1976

[54] POLYCHROMATIC ELECTROLUMINESCENT DEVICE

[75] Inventor: Jacques Lebailly, Caen(Calvados), France

[73] Assignee: U.S. Philips Corporation, New York, N.Y.

[22] Filed: Nov. 8, 1974

[21] Appl. No.: 522,118

Related U.S. Application Data

[62] Division of Ser. No. 423,701, Dec. 11, 1973, Pat. No. 3,875,473.

[30] Foreign Application Priority Data

Dec. 13, 1972  France .............................. 72.44359

[52] U.S. Cl. ................. 357/17; 210/553; 210/226; 313/498; 357/63
[51] Int. Cl.² ........................................ H01L 33/00
[58] Field of Search .................. 250/552, 553, 226; 357/17–19, 63; 315/169 TV; 313/499, 500, 498

[56] References Cited

UNITED STATES PATENTS

| 3,404,305 | 10/1968 | Wright .............................. 357/17 X |
| 3,499,158 | 3/1970 | Lavine et al. ................ 250/211 J X |
| 3,603,833 | 9/1971 | Logan et al. ....................... 357/63 X |
| 3,611,069 | 10/1971 | Calginitis et al. ............ 250/211 J X |
| 3,740,570 | 6/1973 | Kaelin et al. .................. 315/169 TV |

Primary Examiner—Walter Stolwein
Attorney, Agent, or Firm—Frank R. Trifari; George B. Berka

[57] ABSTRACT

A method of energizing an electroluminescent device including several in series connected elementary light sources at least two of which emit radiations of different wavelengths, comprising the steps of supplying the light sources with current pulses of different intensities and controlling the duration of the pulses so that each intensity is inversely proportional to the emitted light flux.

5 Claims, 3 Drawing Figures

POLYCHROMATIC ELECTROLUMINESCENT DEVICE

This is a division of application Ser. No. 423,701, filed Dec. 11, 1973, now U.S. Pat. No. 3,875,473.

The present invention relates to a method of energizing an electroluminescent device formed by several interconnected elementary light sources which are simultaneously energized and emit light rays of different wavelengths.

Electroluminescent devices, for example semiconductor diodes, emit light of a certain wavelength when an electric current is injected into them. In order to obtained a display in successively different colours, it has been endeavoured to realize electroluminescent devices for different colours as a function of a parameter the variations of which can be controlled.

If it suffices to place several electroluminescent sources of different colour beside each other and to supply them selectively, it is necessary to provide a circuit or a supply per source, as a result of which the device becomes more complicated and occupies more space; in the case of mosaics of light dots of the XY matrix type, for example, the increase in supply conductors is a major drawback.

Polychromatic units have been proposed which have several separate sources the colour of which is controlled from a common supply. An example is described in the U.S. Pat. No. 3,499,158, according to which several diodes in the same space are supplied simultaneously and in parallel, each of the said diodes being in series with a resistor of a specific value which determines the voltage at its terminals as a function of the common supply voltage. However, said resistors cause a non-negligible loss of energy which is undesired in particular in the case of mobile apparatus. Said resistors also require extra space which is particularly annoying in the case of mosaics of polychromatic light dots arranged according to XY directions. The device described furthermore requires a supply source the voltage of which must be accurately defined, while the distribution of the current between the various diodes remains inaccurate and as a result of this the mutual light powers are poorly defined.

One of the objects of the present invention is to mitigate the said drawbacks and to provide an electroluminescent device which can successively display different colours, of which the various light sources are supplied by the channel of a common conductor, and of which the supply source permits of efficaciously controlling the light power of each source.

The invention takes into consideration the differences of the characteristics of the known monochromatic electroluminescent sources of which the curves of the emitted light flux as a function of the excitation level are not all identical.

It is known that the sensitivity of the eye is not the same for the various wavelengths of the visible spectrum. The sensitivity curve of the eye should be taken into account when comparing light sources of different colours. The light flux F of an electroluminescent source is thus equal to the product of the emitted power P by a factor V expressing the relative sensitivity of the eye at the emitted wavelength and by the factor K representing the equivalent in light flux per power unit, which factor is to an approximation equal to 680 lumen per watt. It is the light flux F which will be considered hereinafter. It is also to be noted that the curves for the mutually connected light sources mentioned hereinafter will be considered as being plotted with the same scale and the same units so as to be comparable in an acceptable manner when the diagrams comprising said curves are superimposed.

According to the invention, an electroluminescent device which is formed by several inter-connected elementary electroluminescent sources which are energized simultaneously and at least two of which emit light rays of different wavelengths is characterized in that the light sources of the device are connected in series and that the light flux which is emitted by a first source of the device which emits a radiation of a first colour is larger than that of a second source when the same current of intensity $I_1$ is injected into each of the said sources and the light flux which is emitted by the second source of the said device which emits a radiation of a different colour is larger than that of the first source when the same current of intensity $I_2$ which differs from $I_1$ is injected into each of the sources.

The various light sources arranged in groups and supplied in series are traversed simultaneously by a current of intensity I. When said intensity is given a value $I_1$ for which the light flux which is emitted by the sources the radiation of which has a first wavelength $\lambda_1$ is larger than that of all the other sources, the colour which corresponds to said first wavelength is dominant. When said intensity is given a value $I_2$ for which the light flux which is emitted by the sources the radiation of which has a second wavelength $\lambda_2$ is larger than that of all the other sources, the colour corresponding to said second wavelength is dominant. By giving the intensity of the current I different values, the colour of other sources may also be caused to be dominant. The device requires only one supply and enables to obtain successively displays in different colours by varying only the values of the intensity of the injected current.

The curves 1, 2 and 3 of FIG. 1 in the accompanying drawings represent in logarithmic coordinates the variations of the light fluxes F which are emitted by the elementary light sources S1, S2 and S3, respectively, of a device according to the invention as a function of the intensity I of the current which traverses same. Since the sources S1, S2 and S3 are arranged in series, the light fluxes of the three sources at a given instant are represented by the various coordinates corresponding to the same current intensity I; it may be seen that at a current intensity $I_A$, the light flux $F_{A1}$ of the source S1 is dominant, at a current intensity $I_B$ the light flux $F_{B2}$ of the source S2 is dominant and at a current intensity $I_C$, the light flux $S_{C3}$ of the source S3 is dominant. Instead of elementary light sources an assembly of identical series arranged sources may also be considered the light fluxes of which are added to each other.

The device requires no extra resistors which involve loss of energy and require more space. The device displays various colours by the channel of a single supply and avoids the addition of an extra conductor per extra colour. The colour in each of the said elementary sources which is the same for all is defined and adjusted at the supply source.

The number of sources arranged in groups in the device according to the invention is not restricted. The device preferably comprises a single source for each of the desired colours or at least one source of each of the desired colours which may be considered as primary colours which enable other desired colours to be obtained by the additive mixing of the emitted light fluxes.

It is generally desirable that the light impression caused on the eye of the observer by a polychromatic device be substantially of the same level for the various colours which it can display. For that purpose the device is preferably supplied by pulses and the duration of a pulse is reduced when the current intensity during the pulse is higher. Actually it is known that the persistence of light impressions makes it possible to obtain equivalent effects with different light fluxes by acting upon the duration of the stimulant. It is favourable when for each value of the energization strength the duration of the pulse is inversely proportional to the emitted light flux, Of course, said ratio rule may be subject to corrections so as to take into account possible particular contrast conditions of the ambient light or other factors which influence the visibility of the assembly of sources associated in the device.

In the most frequent case in which an apparenrly continuous light impression is endeavoured, the device is supplied by successive pulses having a frequency which is higher than the flicker frequency. In this case the cycle ratio or ratio of the duration of a pulse to the overall duration of the recurrence frequency is reduced when the current intensity is higher. It is favourable when for any value of the energization current said ratio is inversely proportional to the emitted light flux in which said rule may be subject to corrections, as described above, as a function of the particular conditions of frequency, of contrast or other factors which influence the visibility.

In a first embodiment of the device according to the invention, several light sources are placed beside each other and sufficiently closely together in such manner that at the minimum observation distance substantially a single source appears whose colour is the resultant of the additive mixing of the colours of the various energized sources taking into consideration their respective light flux.

The light sources and the energization current intensities are preferably so that the light flux emitted in a dominant colour for at least one value of the intensity of the current which traverses the various sources is up to ten times larger than the light flux emitted by all the other non-dominant sources. The device then appears substantially with the colour of the sources the light flux of which is dominant.

In FIG. 1, if the point of intersection of the curves 1 and 2 is considered, it is found that for the corresponding current $I_p$ the two sources S1 and S2 have the same light flux $F_p$. If the emitted light beams can be mixed by the observer, the apparent colour of the device is that which results from the addition of the colours of S1 and S2, the light flux of the source S3 having substantially no influence.

When in nearly all the cases the curve of the current of a source as a function of the intensity of the current which traverses it shows no discontinuity nor a sudden steepness variation it is possible, by choice of the current intensity corresponding to the point of intersection of the two curves when the diagrams are superimposed, to obtain a composite colour which results from the mixing to an equal extent of at least the two colours of the two sources or groups of sources the curves of which intersect each other and it is also possible by adjustment of the intensity of the current to obtain a full range of intermediate colours which result from the mixing of said colours in variable proportions in accordance with the mutual light fluxes of the various sources. The device thus enables the display of a colour which results from the additive mixing of other colours by injecting a current the intensity value of which lies between those of the currents for which the said other colours are dominant.

All the intermediate colours which result from said additive mixing may also be obtained by mixing in time by means of pulses of various intensities which succeed each other rapidly, each of said intensities making a certain colour dominant and the persistence of the light impressions permitting the eye of the observer to realize the sum of the received impressions. The duration of the pulses, in this case is a function of the light flux emitted in each dominant colour and of the necessary proportion of said dominant colour in the composition of the desired additive mixture.

All these combinations are also possible in another embodiment of the invention according to which the device comprises an optical system which tends to superimpose the light beams originating from different sources of the device. For example, the various sources are placed beside each other on a base plate and covered with a cap enveloping all said sources.

In another embodiment, several sources arranged in groups are superimposed in a device, each source placed on another source passing at least partly the radiation emitted by the latter. For example, the device consists mainly of a stack of sources having a planar structure as a result of which the series arrangement is obtained and in which the stacking is carried out so that the wavelength of the emitted radiation decreases.

In the embodiment mentioned hereinafter, the various light sources of a device are chosen as a function of the colours to be obtained among the electroluminescent elements of the known type the curves of the light flux of which as a function of the injected current show the suitable profile.

According to a possible choice, the device comprises at least an electroluminescent elementary source of a first colour the light flux of which is restricted to a substantially constant value at least for a range of current intensities of the current injected above a particular value, for example, under the influence of the saturation phenomenon, and at least an electroluminescent elementary light source of another colour the light flux of which various in the same range of current intensities of the injected current.

An example of an electroluminescent current having a light flux which varies little in the current intensity range consists of a semiconductor diode having a p-n junction of gallium phosphide doped with zinc and oxygen, which emits a radiation of red colour and which, from a certain current density, shows the saturation phenomenon of the radiation recombination centres. These diodes may be connected to a diode which does not show a saturation phenomenon.

According to a likewise possible choice the device comprises at least one electroluminescent elementary light source of a first colour the light flux of which, at least for a range of current intensities of the injected current, is substantially proportional to said intensity, and at least one electroluminescent source of another colour the light flux of which for the same intensity range follows a different rule.

An example of electroluminescent source having a light flux which is substantially proportional to the intensity of the injected current, at least for a given range of injected current, consists of a semiconductor diode having a *p-n* junction which is manufactured from a material having a direct band structure, for example a ternary compound, for example gallium arsenide phosphide, gallium aluminium arsenide, gallium indium phosphide, indium aluminium phosphide, of desired composition, or a binary compound, for example, gallium nitride. Certain materials having an indirect band structure also show said property, for example, nitrogen-doped gallium phosphide, for example, that which emits a radiation of green colour, or silicon carbide.

According to a likewise possible choice the device comprises at least one electroluminescent elementary light source of a first colour the light flux of which at least in a range of the injected current is substantially proportional to a power $n$ of the current intensities, $n$ being a number higher than 1, and at least one electroluminescent elementary source of a different colour the light flux of which follows a different rule in the same current intensity range.

An electroluminescent source having a light flux which is substantially proportional to the power $n$ of the current intensity of the injected current is that of a semiconductor diode which emits an infrared radiation the emitting surface of which is covered with a photoluminescent converter for wavelengths. Such converter coverings are well known in the field of optoelectronics, certain of them relate to a sequential transition phenomenon having two photons and their light flux varies substantially with the square of the incident light flux, others relate to a sequential transition phenomenon having three photons and their light flux varies substantially with the third power of the incident light flux. These sources are, for example, diode of gallium arsenide which has been treated so as to emit infrared radiation of 0.97 $\mu$ wavelength and which are covered with a transparent synthetic material in which grains of photoluminescent material are embedded, such as sodium and yttrium fluoride $NaYF_4$ which is doped with ytterbium and erbium and emits a green radiation.

According to a likewise possible choice the device comprises at least two electroluminescent elementary sources of different colours the former of which is manufactured from a semiconductor material having a strong concentration of impurities in which a current of a low strength causes only recombinations which do not emit radiation and the latter of which is manufactured from a semiconductor material having a weaker concentration of impurities the forbidden band width of which is smaller than the material of the first source, which has a small efficiency for strong currents, but in which a current of small intensity causes radiation recombinations, An example of an electroluminescent source of the type of the first above-mentioned source consists of a diode having a *p-n* junction which is manufactured from a III–V compound, for example, gallium and indium phosphide, having a direct band structure, which emits a yellow radiation having a concentration of impurities which exceeds $10^{16}$ per $cm^3$ and the luminous efficiency of which is very weak at a low injection level. An example of an electroluminescent source of the type of the above-mentioned second source consists of a diode having a *p-n* junction which is manufactured from doped gallium arsenide phosphide so as to emit a radiation of red colour and a concentration of impurities which is lower than $10^{15}$ per $cm^3$.

The different elementary sources of a device may have different shapes and/or different active surfaces. Among the light source of the same colour and the same structure and manufactured from the same material, the active surface forms a parameter which makes it possible to determine a source the curve of the light flux of which as a function of the current intersects the curves of the other sources considered when the diagrams are superimposed. In all the cases in which the light flux which is emitted by a source is not exactly proportional to the current, a difference of active surface corresponds to a difference in light flux emitted at the same current and thus to a shift of the curve of the light flux as a function of the intensity of the energization current. If, for example, a diode having an electroluminescent junction with an area of $0.1$ $mm^2$ of gallium phosphide which emits a red radiation is energized with a current of $0.1$ A, the same diode whose area is ten times larger and which is energized by the same current and thus with a 10 times weaker current density has a relative efficacity which is only two times weaker and thus an overall light flux which is five times larger.

For that purpose, a shift of the curve is obtained, if desired, by means of an attenuation absorption filter with which the source having too high a light flux may be provided.

In the case in which the device is to form a polychromatic elementary dot of a matrix which comprises a large number of dots so as to form a display screen, for example, it is desirable that the brightnesses of the various sources of a device be comparable and that the areas of the various sources are of the same order and smaller than the resolving power of the observer's eye.

The present invention may be used to manufacture polychromatic display device, in particular light signals for supplying colour information. The invention may preferably be used for the manufacture of polychromatic display mosaics and in particular according to XY directions which according to the invention requires only one conductor per line and per column. Display screens can be manufactured by means of devices according to the invention which are energized by scanning.

The invention will be described in greater detail with reference to the accompanying drawings, in which FIG. 1 is a logarithmic graph showing the variation of light flux with current intensity.

Figure 2:
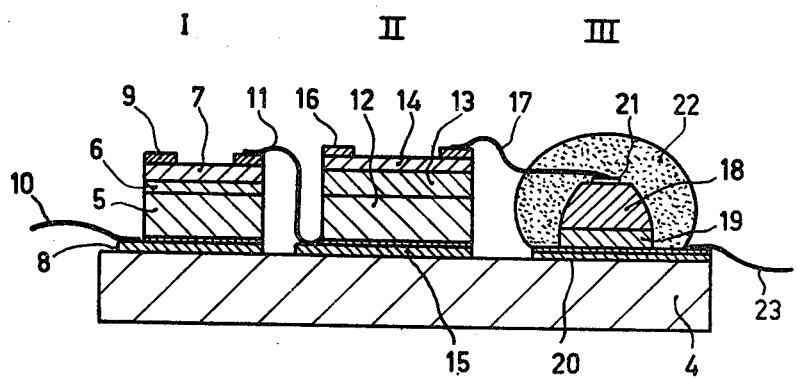
FIG. 2 is a diagrammatic cross-section view of three electroluminescent sources juxtaposed in a polylithic device according to the invention.

The diagrammatic cross-sectional view of FIG. 2 shows three elementary light sources of a device according to the invention which are juxtaposed on a common base plate 4 of insulating material Of course said three sources are placed as closely together as possible in which the necessary insulation and the practical manufacturing possibilities are taken into account. The first source 1 is a planar electroluminescent diode which is manufactured on a substrate 5 by epitaxial deposition of a layer 6, then of a layer 7 of the opposite conductivity type; the *p-n* junction thus formed emits a radiation having a wavelength $\lambda_4$ when a current is injected into it via metal deposits 8 and 9 on which the conductive wires 10 and 11 are soldered.

The second source II is also a planar electroluminescent diode which is realized on a substrate 12 by epitaxial deposition of a layer 13 in which a layer 14 of the opposite conductivity type is diffused; the p-n junction thus formed emits a radiation having a wavelength $\lambda_5$ differing clearly from $\lambda_4$, when a current is injected via the metal deposits 15 and 16 on which conductive wires 11 and 17 are soldered.

The third source III is an electroluminescent diode which comprises a p-n junction between two regions 18 and 19 which emits an infrared radiation when a current is injected via the metal deposits 20 and 21 on which the conductors 23 and 17 are soldered. Said diode is covered with an envelope 22 of a transparent synthetic material in which a photoluminescent material is embedded which emits a visible radiation having a wavelength $\lambda_6$ which differs clearly from $\lambda_4$ and $\lambda_5$, by absorption of infrared radiation which is emitted by the diode 18–19.

The connections between the diodes 11 and 17 are such that the three elementary sources described are in series and are all in the forward direction when the conductor 10 is connected to the negative terminal of a supply source and the conductor 23 is connected to the positive terminal of the same source. The current supplied by said supply source is adjustable. The source I emits, for example, a radiation having a wavelength of 0.69 $\mu$m and has a light flux which as a function of the intensity of the injected current varies according to curve 1 of the diagram of FIG. 1. The source II emits a radiation having a wavelength 0.58 $\mu$ and the light flux thereof varies as a function of the intensity of the injected current according to curve 2 of the diagram of FIG. 1. The source III emits a radiation having a wavelength of 0.47 $\mu$ and the light flux thereof varies as a function of the intensity of the injected current according to curve 3 of the diagram of FIG. 1. When via the three sources of the device a current of intensity $I_A$ is conveyed through the conductors 10 and 23, the light flux which is emitted by the source I is significantly higher than that emitted by the sources II and III and the device displays red. For a current of intensity $I_B$, the yellow colour of source II is dominant, the fluxes emitted by the sources I and III being significantly weaker. For a current $I_C$ the greem of the source III is dominant.

In order to bring at the same level the light impression which is produced on an observer by the device of FIG. 2 and excited by several currents of intensities $I_1$, $I_B$ or $I_C$, said excitation is obtained by means of pulses which are repeated with a frequency which is higher than the flicker frequency, the duration of the pulses being inversely proportional to the value of the emitted light flux.

Figure 3:
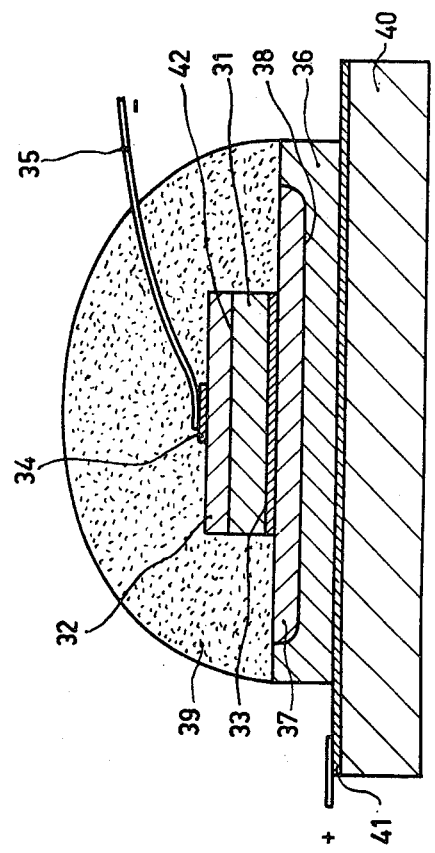
FIG. 3 is a diagrammatic cross-sectional view of a device according to the invention comprising two superimposed elementary sources.

The diagrammatic cross-sectional view of FIG. 3 shows a device having two superimposed sources. A first source consists of a diode having a p-n junction 42 which comprises a region 31 of the p type and a region 32 of the n type, metal deposits 33 and 34, the deposit 33 constituting a transparennt grid, and a connection 35. Said first source is soldered to a second light source which consists of a diode having a p-n junction 38 which comprises a region 36 of the p type and a region 37 of the n type, the junction 38 emitting an infrared radiation which is converted into visible radiation by a cap 39 of photoluminescent material. The second source is connected to a support 40 which is covered with a conducting material 41. The layer 41 is connected to a positive terminal of a current supply, the conductor 35 is connected to the negative terminal. For example, the junction 42 emits a radiation having a wavelength of 0.97 $\mu$m and the phosphorescent material 39 emits a radiation having a wavelength of 0.47 $\mu$m. When the current supplied by the supply source has an intensity $I_4$, the light flux emitted by the cap 39 is negligible and the light flux which is emitted by the junction 42 is only visible via the cap 39 which is transparent to the emitted radiation. The luminous efficiency of the cap 39 increases with the square of the intensity of the light flux emitted by the junction 38. The luminous efficiency of the junction 42 decreases with the intensity of the current which is injected into it due to a saturation phenomenon of the radiation recombination centres. For a current of intensity $I_5$ which is higher than $I_4$, the light flux is dominant which is emitted by the cap 39. Between the two values $I_4$ and $I_5$ any desired proportion of the light flux of both sources can be obtained and, besides the colours emitted by each of them, the resultant colours of the combination of these two colours may be displayed and that in any proportion.

Figure 1:
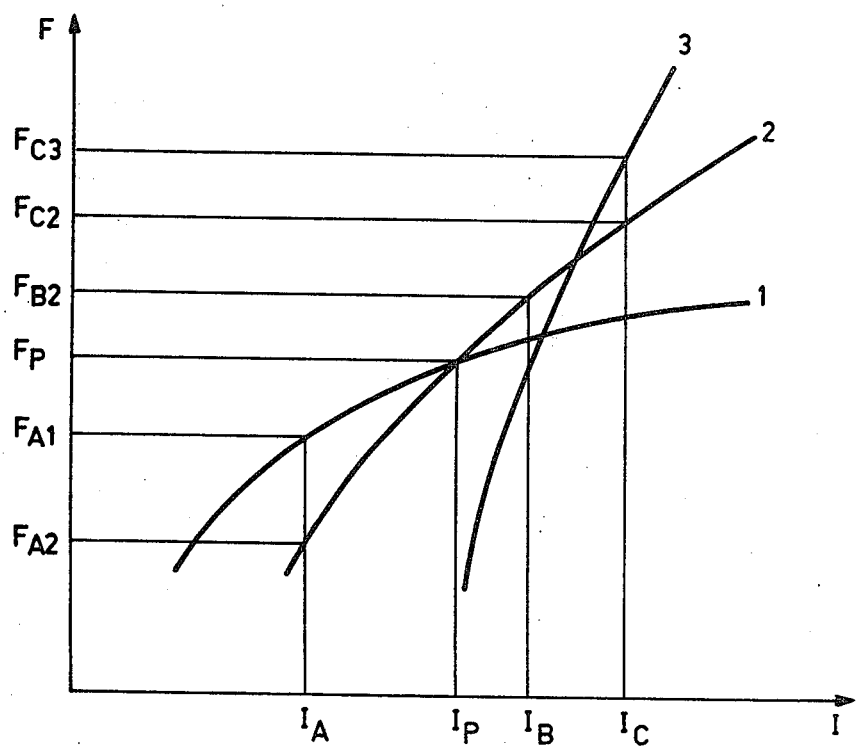

An example of the manufacture of the device according to the invention of which the sources have light fluxes according to the curves of FIG. 1 will now be described.

The first source consists of a diode of gallium phosphide doped with zinc and oxygen and obtained by liquid epitaxy according to the conventional processes. The emissive surface of said diode is, for example, equal to 0.1 mm². The emitted light flux at 0.69 $\mu$m is 9 millilumen with a current of 20 mA, 15 millilumen at 100 mA and 20 millilumen at 700 mA.

The second source consists of a diode of gallium arsenide phosphide $GaAs_{1-x}P_x$, in which $x$ is between 0.80 and 0.85 which is obtained by epitaxy according to the conventional processes and is doped with nitrogen. The emissive surface of said diode is five to 20 times larger than that of the first source and is preferably equal to 1 mm². The emitted light flux at 0.58 $\mu$m is 2 millilumen with a current of 20 mA, 30 millilumen with 100 mA and 120 millilumen at 700 mA.

The third source consists of a diode of silicondoped gallium arsenide which emits a radiation at 0.97 $\mu$m and which is covered with an epoxy resin in which grains of sodium yttrium fluoride $NaYF_4$ which is doped with ytterbium and erbium are embedded. The emissive surface of said source is two to 10 times larger than that of the first source and is preferably equal to 0.5 mm². The light flux emitted at 0.54 $\mu$m is 0.1 millilumen at a current of 20 mA, 10 millilumen at 100 mA and 800 millilumen at 700 mA.

For displaying the red, a current of 20 mA is continuously injected into the device. The light flux of the first source is dominant.

For displaying the yellow a current of 100 mA is injected into the device by pulses of 0.3 msec. at a frequency of 1000 Hz. The light flux of the second source is dominant and added to this is possibly, if the light beams which originate from the three sources can be mixed for the eye of the observer, the light fluxes of the first and third sources of which the mixture gives a yellow impression.

For displaying the green a current of 700 mA is injected into the device. The light flux of the third source is dominant. The current is injected by pulses of 0.01 msec. at a frequency of 1000 Hz.

What is claimed is:

1. A method of energizing a polychromatic electroluminescent device including series connected at least a diode of gallium phosphide doped with zinc and oxygen and having an emissive surface of about 0.1 mm$^2$, a diode of gallium arsenide phosphide GaAs$_{1-x}$P$_x$,X being between 0.80 and 0.85, which is doped with nitrogen and having an emissive surface about 1 mm$^2$, and a diode of silicon-doped gallium arsenide which is covered with an epoxy resin in which grains of soidum yttrium fluoride which is doped with ytterbium and erbium are embedded, and whose emissive surface is about 0.5 mm$^2$, characterized in that a current of 20 mA is continuously injected for displaying red, a current of 100 mA is injected by pulses of 0.3 msec. with a frequency of 1000 Hz for displaying yellow and a current of 700 mA is injected by pulses of 0.1 msec at a frequency of 1000 Hz for displaying green.

2. A method of energizing a polychromatic electroluminescent device having series connected and equally biased diode light sources at least two of which emit radiations at different wavelengths and wherein the light flux emitted by a first source is larger than that of a second source when the same current intensity $I_1$ is injected into each source, and the light flux which is emitted by the second source is larger than that of the first source when the same current intensity $I_2$ which differs from $I_1$ is injected into each source, said light sources being supplied with direct current pulses of different intensities and controllable durations, the said duration for each intensity being inversely proportional to the emitted light flux.

3. A method as claimed in claim 2, characterized in that the current pulses have a frequency which exceeds the flicker frequency and have a cycle proportion which is inversely proportional to the emitted light flux.

4. A method as claimed in claim 2, characterized in that a colour is displayed which results from the additive mixing of other colours by injecting into the device a current whose intensity has a value between the values of the current intensity for which said other colours are dominant.

5. A method as claimed in claim 2, characterized in that a colour is displayed which results from the additive mixing of other colours by injecting into the device pulses of different intensities each of which makes a certain colour dominant, said pulses succeeding each other in a time which is lower than the duration of the persistence of the light impressions, the relative duration of said various pulses being function of the emitted light flux in each dominant colour and of the composition of the desired additive mixture.

* * * * *